United States Patent
Yang

(10) Patent No.: US 8,848,850 B2
(45) Date of Patent: Sep. 30, 2014

(54) PULSE WIDTH MODULATION RECEIVER CIRCUITRY

(71) Applicant: Intel Corporation, Santa Clara, CA (US)

(72) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 13/626,460

(22) Filed: Sep. 25, 2012

(65) Prior Publication Data

US 2014/0086363 A1    Mar. 27, 2014

(51) Int. Cl.
*H04L 7/02*    (2006.01)

(52) U.S. Cl.
USPC ............ 375/360; 375/375; 327/159; 327/160

(58) Field of Classification Search
USPC ......... 375/141, 145, 147, 149, 324, 325, 327, 375/328, 354, 360, 371, 373, 375, 376; 327/141, 147, 150, 151, 155, 156, 159, 327/160
See application file for complete search history.

(56) References Cited

U.S. PATENT DOCUMENTS 6,225,926 B1 * 5/2001 Hayase .................. 341/110
2012/0051241 A1 * 3/2012 Mori et al. ............. 370/252

* cited by examiner

*Primary Examiner* — Dac Ha
(74) *Attorney, Agent, or Firm* — Blakely, Sokoloff, Taylor & Zafman LLP

(57) ABSTRACT

Mechanisms and techniques to evaluate data for a high speed I/O receiver logic. In an embodiment, a receiver circuit shifts a bit into a shift circuit in response to a rising edge of a data signal, where a count is started in response to the bit being subsequently shifted out of the shift circuit. Based on a value of the count, the receiver circuit generates a control signal for preparing physical layer receiver logic to transition to a burst mode of operation. In another embodiment, a receiver circuit includes a frequency divider to operate based on a data signal and a clock signal, wherein, based on operation of the frequency counter, a control signal is generated to indicate a line reset for physical layer receiver logic. The receiver circuit provides a feedback signal, based on the control signal, which is to limit activation of the frequency divider.

30 Claims, 10 Drawing Sheets

PULSE WIDTH MODULATION RECEIVER CIRCUITRY

BACKGROUND

1. Technical Field

Embodiments of the invention relate generally to the field of high speed input-output (I/O) transceivers. More particularly, embodiments of the invention relate to an apparatus, system, and method for receiving pulse width modulated (PWM) signals.

2. Background Art

Semiconductor devices, computers, and other digital systems continue to increase their operating data rate, including the communication of digital differential signals of increasingly high transition rates. The transition rate refers to the rate at which a digital signal transitions between states. Successive generations of digital devices are approaching high-speed input/output (I/O) communications data rates on the order of giga-transitions per second, and even tens of giga-transitions per second. One problem is that as the transition rate increases, signal integrity degrades. Consequently, there is an increasing need for high-speed I/O receivers capable of accommodating such high transition rates by accurately identifying differential signal transitions and differential signal states.

Moreover, as power dissipation becomes a standard performance benchmark for consumer electronics—for example, tablet PCs, smart phones, low power laptops or net-books, etc.—traditional high speed input-output (I/O) transceivers used in processors of consumer (or other) devices are not optimum for low power operation. Such traditional high speed I/O transceivers have many analog components which are not scalable to newer process technologies. Traditional high speed I/O transceivers are unable to meet the stringent low power specifications of Mobile Industry Processor Interface (MIPI®) as described in the MIPI® Alliance Specification for M-PHY$^{SM}$ Version 1.00.00 of Feb. 8, 2011 and approved on Apr. 28, 2011.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein generally relate to an apparatus, system and method for providing functionality to evaluate data sent to a high speed I/O receiver circuit. In one embodiment, a receiver circuit comprises an edge detector to receive a data signal and to generate a transition of a first signal in response to a rising edge of the data signal. The receiver circuit may further comprise a shift circuit including a plurality of stages to receive a bit in response to the transition and to shift the bit based on a clock signal. The receiver circuit may further comprise a counter to start a count in response to an output of the bit from the plurality of stages, and detector logic to detect a value of the count. Based on the value, the detector logic may generate a control signal for preparing physical layer receiver logic to transition to a burst mode of operation.

In another embodiment, a receiver circuit comprises first logic to generate a first signal based on a clock signal and a data signal, the first signal including a first sequence of pulses. The receiver circuit may further comprise a frequency divider to receive the first signal and to generate a second signal including a second sequence of pulses which are based on the first sequence of pulses. The receiver circuit may further comprise a cycle counter to receive the second signal and to assert a control signal in response to a completion of N cycles of the second sequence of pulses, where N is an integer, the control signal to indicate a line reset to physical layer receiver logic. In an embodiment, the first logic is further to receive a feedback signal based on the control signal, the feedback signal to limit activation of the frequency divider by the first logic, wherein the first logic to generate the first signal further based on the feedback signal.

Figure 1:
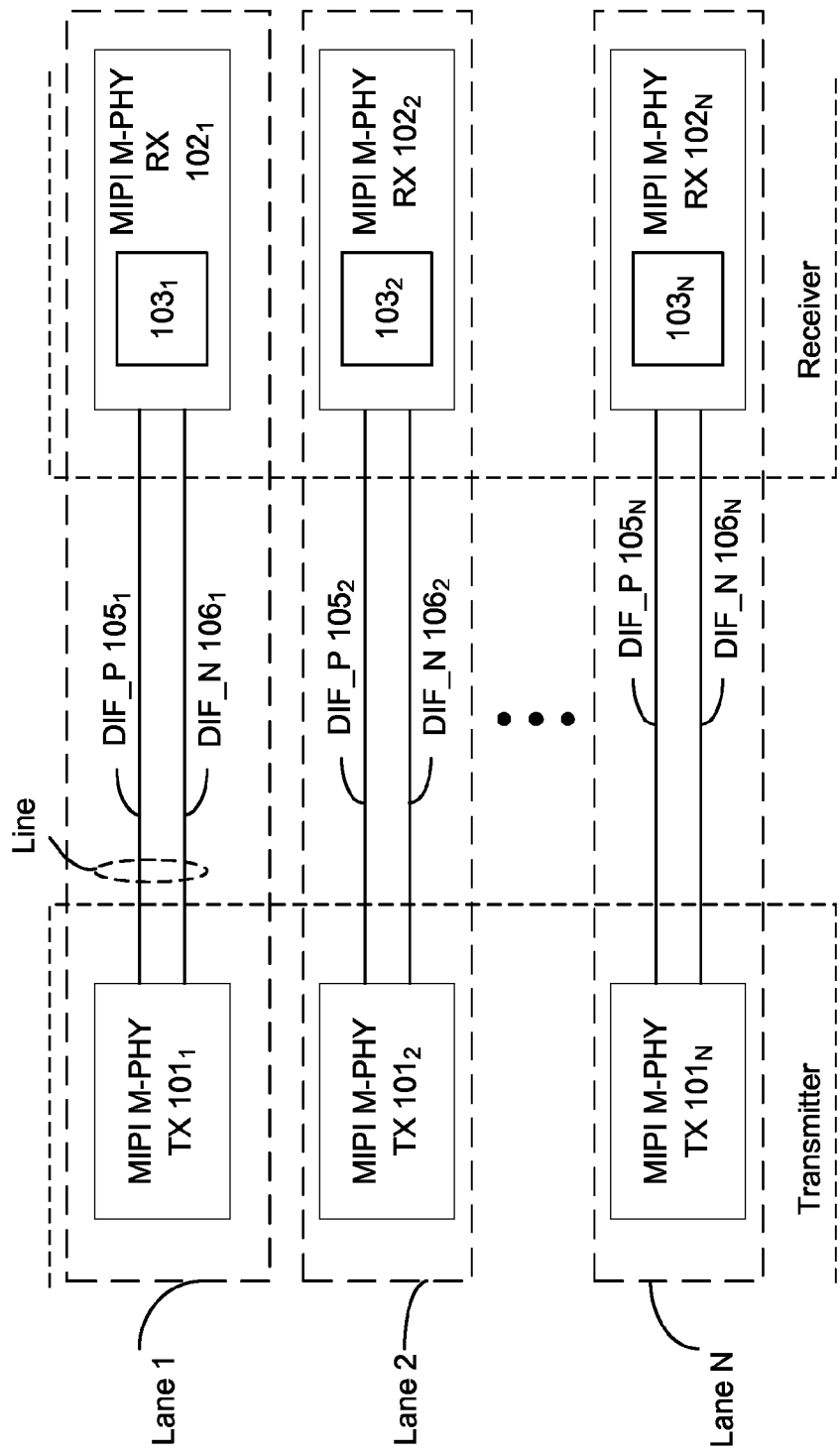
FIG. 1 is a block diagram illustrating elements of a system including receiver logic for evaluating, according to an embodiment, data exchanged via an input-output (I/O) link.

FIG. 1 illustrates elements of a system 100 including receiver logic for evaluating, according to one embodiment, a differential data signal received via an input-output (I/O) link. In one embodiment, each receiver (e.g., $102_1, 102_2, \ldots, 102_N$) includes a corresponding logic architecture $103_1, 103_2, \ldots, 103_N$ for evaluating a differential data signal. While the system 100 is described herein as a MIPI® M-PHY$^{SM}$ Link as defined by the MIPI® Alliance Specification for M-PHY$^{SM}$ Version 1.00.00 of Feb. 8, 2011 and approved on Apr. 28, 2011, in other embodiments, the system 100 is any I/O link which is operable for high speed data recovery at its receivers.

In one illustrative embodiment, the system 100 includes a MIPI® M-PHY$^{SM}$ Link which comprises MIPI® M-PHY$^{SM}$ transmitters (M-TXs) $101_1, 101_2, \ldots, 101_N$, point-to-point interconnects DIF_P $105_1, 105_2, \ldots, 105_N$ and DIF_N $106_1, 106_2, \ldots, 106_N$, and MIPI® M-PHY$^{SM}$ receivers (M-RXs) $102_1, 102_2, \ldots, 102_N$. In the embodiments discussed herein, the M-RXs $102_1, 102_2, \ldots, 102_N$ comprise logic architectures $103_1, 103_2, \ldots, 103_N$, one or more of which is for evaluating a received differential data signal. The system 100 comprises Lanes 1-N, where each lane includes a M-TX, M-RX, and a pair of point-to-point interconnects DIF_P and DIF_N that form a LINE. The term "DIF_P" and "DIF_N" herein refer to differential signals as defined by the MIPI® Alliance Specification for M-PHY$^{SM}$ Version 1.00.00 of Feb. 8, 2011 and approved on Apr. 28, 2011.

In one embodiment, the transmitter and receiver of the system 100 are in different processors positioned in a consumer electronic (CS) device. In one embodiment, the CS device may be a tablet PC, a smart-phone, or any other such computer device. In one embodiment, the system 100 is coupled to a display unit (not shown) which is operable to display a version of data received by the receiver $102_1$. In one embodiment, the display unit is a touch pad.

So as not to obscure the embodiments of the invention, TX $101_1$, DIF_P $105_1$, DIF_N $106_1$, RX $102_1$, and logic unit $103_1$ are discussed. The discussion is applicable to other TX and RX logic of the system 100.

In one embodiment, the signals from the TX $101_1$ are differential PWM signals (DIF_P $105_1$ and DIF_N $106_1$). In one embodiment, the RX $102_1$ includes a first stage that converts the differential signals to a PWM single ended signal. In one embodiment, the PWM single ended signal is received by the logic unit $103_1$ and converted into a Non-Return Zero (NRZ) signal for further processing.

Figure 2:
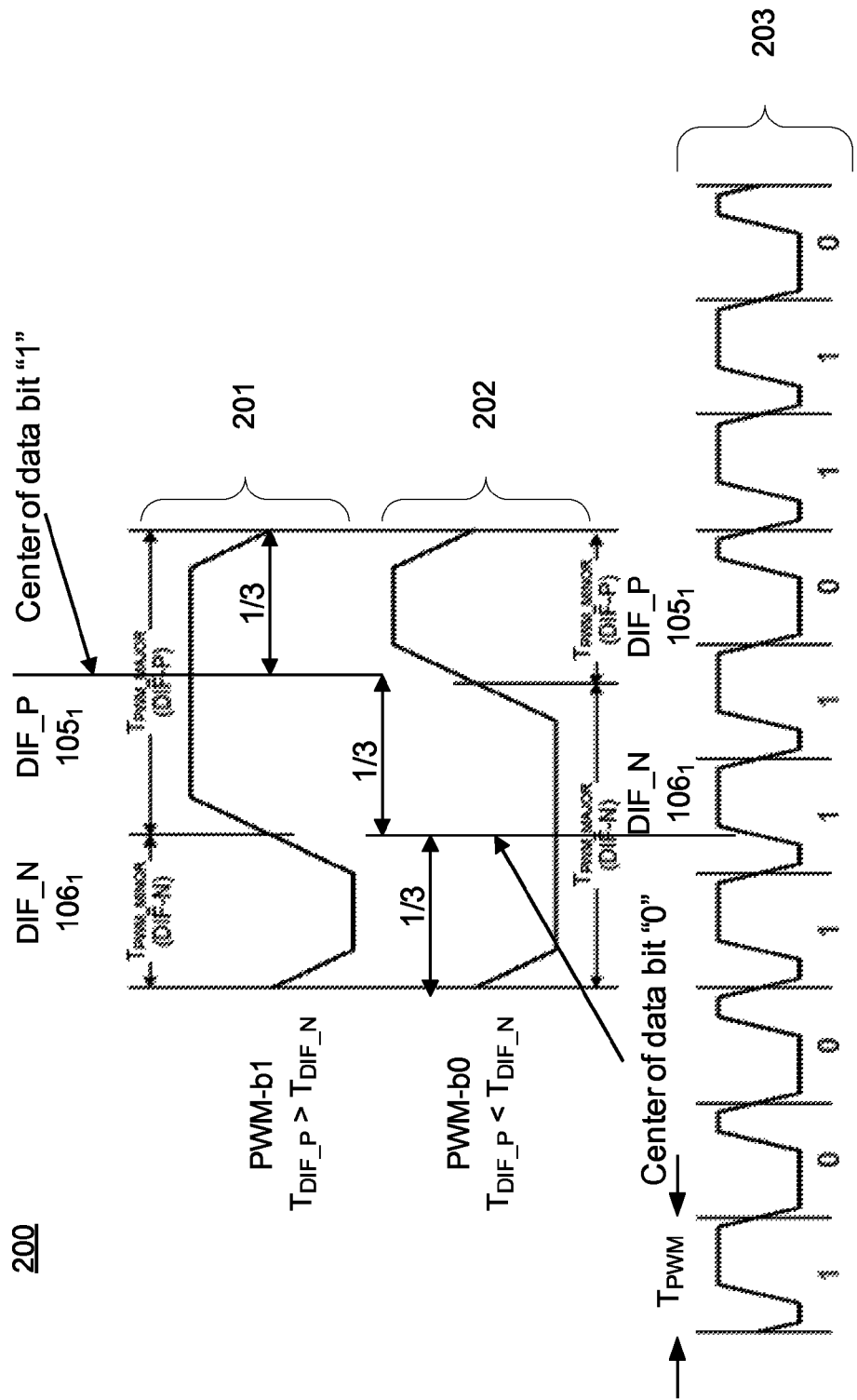
FIG. 2 is a timing diagram illustrating elements of a pulse width modulated (PWM) waveform for communicating data evaluated according to an embodiment.

FIG. 2 illustrates elements of a pulse width modulated (PWM) waveform 200 as used in the embodiments described herein. PWM is a bit modulation scheme carrying data information in the duty cycle of the waveform. In one embodiment, the point-to-point interconnects DIF_P $105_1, 105_2, \ldots, 105_N$ and DIF_N $106_1, 106_2, \ldots, 106_N$ transmit PWM waveforms (also referred to as DIF_P $105_1$ and DIF_N $105_1$). The PWM scheme has self-clocking properties because the clock information is in the period of the PWM waveform 200. Each bit in the PWM waveform 200 consists of a combination of two sub-phases, a DIF_N $106_1$ followed by a DIF_P $105_1$. One of the two sub-phases is longer than the other, i.e. $T_{PWM\_MAJOR} > T_{PWM\_MINOR}$, depending on whether the bit in the PWM waveform 200 is a binary '1' or a binary '0.' The binary information in the PWM waveform 200 is in the ratio of the duration of the DIF_N $106_1$ and DIF_P $105_1$ states.

For example, if the LINE state is DIF_P for the majority of the bit period, the bit is a binary '1' 201 (PWM-b1). Likewise, if the LINE state is DIF_N for the majority of the bit period, the bit is a binary '0' 202 (PWM-b0). The term "LINE" herein refers to a point-to-point differential serial connection.

Each bit period of the PWM waveform 200 contains two edges, where the falling edge is at a fixed position and the rising edge position is modulated. Accordingly, the PWM bit stream 203 explicitly contains a bit clock with period $T_{PWM}$, which equals the duration of one bit. In one embodiment, the logic unit $103_1$ of the RX $102_1$ is operable to process the PWM waveform 200 to evaluate a transition and/or state thereof.

Figure 3A:
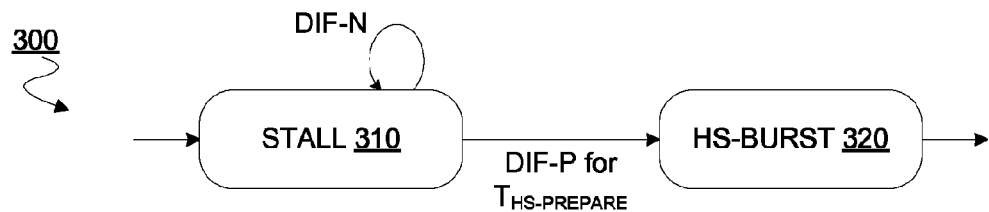
FIG. 3A is a state diagram illustrating elements of a state transition indicated by a control signal generated according to an embodiment.

Certain embodiments variously provide techniques and mechanisms for evaluation of a data signal to determine whether a receiver is to be configured for a particular mode. FIG. 3A illustrates elements of a state diagram 300 including various states (also referred to herein as modes) corresponding to respective modes of a receiver which, for example, provides functionality of one or more of MIPI® M-PHY$^{SM}$ receivers $102_1, 102_2, \ldots, 102_N$. State diagram 300 may, for example, be implemented by a state machine of a Type-I receive module (M-RX), although certain embodiments are not limited in this regard. MIPI® M-PHY$^{SM}$ specifications define features of such a Type-I M-RX.

In an embodiment, a receiver operating according to state diagram 300 may include or couple to circuitry—for example, logic unit $103_1$—to evaluate a data signal which is based on received PWM data signals. Such evaluation may result in the circuitry generating a control signal to implement, at least in part, a transition of physical layer receiver logic—e.g. other logic of M-RX $102_1$—to a burst mode of operation. By way of illustration and not limitation, at some point in time, the physical layer receiver logic may be configured for a STALL mode 310 of state diagram 300—e.g. where STALL mode 310 is a power saving state between times when the receiver is to participate in high speed burst data exchanges. STALL mode 310 may include, for example, some or all of the features of the STALL mode of a Type-I M-RX according to a MIPI® M-PHY$^{SM}$ specification.

While the receiver is in STALL mode 310, logic unit $103_1$, for example, may evaluate the data signal to detect whether DIF-P (or similarly, DIF-N) of received differential data signals is at a particular logic value, such as binary "1". Logic unit $103_1$ may further detect whether DIF-P has been at that logic value for some threshold period of time.

For example, if the circuit detects that DIF-P has been asserted high for at least some threshold time, the circuit may generate a control signal to indicate that physical layer receiver logic is to transition to a burst mode—e.g. a high speed burst (HS-BURST) mode 320 shown in state diagram 300. HS-BURST mode 320 may include some or all of the features of the HS-BURST mode of a Type-I M-RX according to a MIPI® M-PHY$^{SM}$ specification. In such an embodiment, the threshold period of time may be $T_{HS-PREPARE}$, as defined in a MIPI® M-PHY$^{SM}$ specification. By contrast, if the circuit instead determines that the DIF-N signal is being asserted, or that DIF-P has not been continuously asserted for at least the threshold period of time, then the circuit may forego any signaling to indicate a mode change, and the physical layer receiver logic may remain in a configuration for STALL mode 310.

Figure 3B:
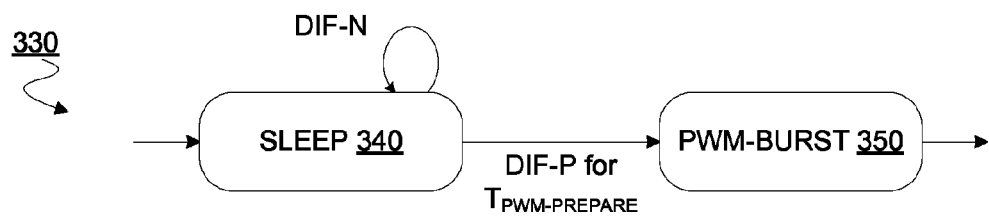
FIG. 3B is a state diagram illustrating elements of a state transition indicated by a control signal generated according to an embodiment.

FIG. 3B illustrates elements of another state diagram 330 describing a mode change of a receiver in response to data evaluation according to an embodiment. State diagram 330 may include some or all of the features of state diagram 300, although certain embodiments are not limited in this regard. State diagram 330 may, for example, be implemented by a state machine of a receiver compatible with the definition of a Type-I M-RX in a MIPI® M-PHY$^{SM}$ specification.

Similar to the discussion of state diagram 300, a receiver operating according to state diagram 330 may include, or couple to, circuitry to evaluate a data signal and, in embodiment, generate a control signal for transitioning physical layer receiver logic to a burst mode. At some point in time, such physical layer receiver logic may be configured for a SLEEP mode 340 of state diagram 330. SLEEP mode 340 may be a power saving state between times when the receiver is to participate in low speed burst data exchanges—e.g. as compared to the high speed burst data exchanges discussed herein with reference to FIG. 3A. SLEEP mode 340 may include some or all of the features of the SLEEP mode of a Type-I M-RX according to a MIPI® M-PHY$^{SM}$ specification.

While the receiver is in SLEEP mode 340, logic unit $103_1$, for example, may evaluate the data signal to detect whether DIF-P (or similarly, DIF-N) of a received PWM data signals is at a particular logic value, such as binary "1". Logic unit $103_1$ may further detect whether DIF-P has been at that logic value for some threshold period of time. If the circuit detects that DIF-P has been asserted high for at least some threshold time, the circuit may, in an embodiment, generate a control signal to indicate that physical layer receiver logic is to transition to a burst mode—e.g. a low speed burst (PWM-BURST) mode 350 shown in state diagram 330. PWM-BURST mode 350 may include some or all of the features of the PWM-BURST mode of a Type-I M-RX according to a MIPI® M-PHY$^{SM}$ specification, for example. In such an embodiment, the threshold period of time may be $T_{PWM\text{-}PREPARE}$, as defined in a MIPI® M-PHY$^{SM}$ specification. By contrast, if the circuit instead determines that the DIF-N signal is being asserted, or that DIF-P has not been continuously asserted for at least the threshold period of time, then the circuit may forego any signaling to indicate a mode change, and the physical layer receiver logic may remain in a configuration for SLEEP mode 340.

In certain embodiment, circuit logic generates a control signal—e.g. for a transition to HS-BURST 320 or PWM-BURST 350—which indicates a PREPARE condition compatible with a MIPI® M-PHY$^{SM}$ specification. Per MIPI® M-PHY$^{SM}$, PREPARE is the initial sub-state of BURST which allows settling of LINE levels and transceiver settings before the bitstream is started. LINE state during PREPARE is DIF-P. If an M-RX is configured to terminate the LINE during the BURST, the termination may have to be enabled during PREPARE. Signal integrity may have to be maintained during any change of termination status. At the end of PREPARE, the LINE signals may have to be settled. The length of PREPARE in the local M-TX is greater than the corresponding value of the remote M-RX parameters in the appropriate MODE, i.e., $T_{HS\_PREPARE}$ in HS-MODE, $T_{PWM\_PREPARE}$ in PWM-MODE and $T_{SYS\_PREPARE}$ in SYS-MODE. $T_{PWM\_PREPARE}$ of the local M-TX may not be allowed to exceed the minimum value of $T_{LINE\text{-}RESET\text{-}DETECT}$.

Figure 3C:
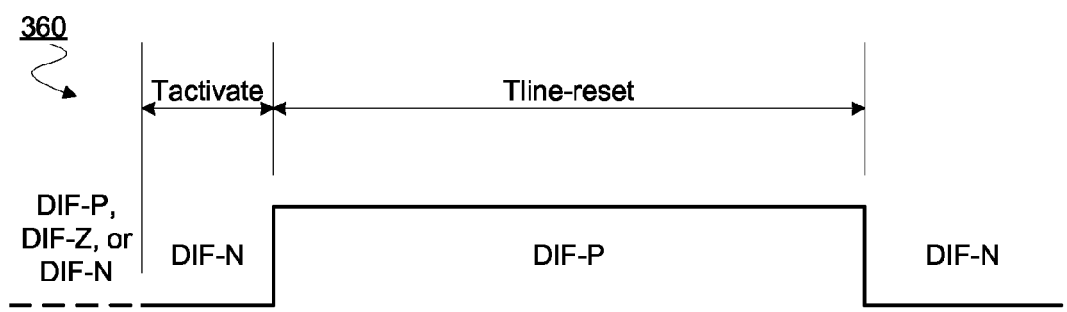
FIG. 3C is a timing diagram illustrating elements of a data signal subject to evaluation according to an embodiment.

FIG. 3C illustrates elements of a data signal 360 which is evaluated according to an embodiment. Data signal 360 may be generated by a conversion of a differential signal into a corresponding single-ended PWM signal. Such a differential signal may be received by logic which provides some or all of the functionality of MIPI® M-PHY$^{SM}$ RX 102$_1$, for example. Evaluation of data signal may result in logic unit 103$_1$ or other such logic, generating a signal to indicate a line reset condition—e.g. on which is according to the LINE-RESET condition of a MIPI® M-PHY$^{SM}$ specification.

In MIPI® M-PHY$^{SM}$, the LINE-RESET is the lowest level reset mechanism for resetting a M-RX via a LINE during operation in case of malfunction. The LINE-RESET condition is a long DIF-P period, which can never occur during normal operation. A MODULE—i.e. an indication according to a MIPI® M-PHY$^{SM}$ specification for either an M-RX or a M-TX—may have to support LINE-RESET in all ACTIVATED states (such as high-speed mode HS-MODE or low speed mode LS-MODE). Per MIPI® M-PHY$^{SM}$, a protocol layer of a transmitter shall ensure, just before LINE-RESET, the M-TX drives DIF-N for at least $T_{ACTIVATE}$ so that an M-RX, which might be in a HIBERN8 mode, is ACTIVATED before the LINE-RESET condition is driven. For LINE-RESET, the M-TX shall drive DIF-P for $T_{LINE\text{-}RESET}$. An M-RX shall be reset when DIF-P is observed on the LINE for $T_{LINE\text{-}RESET\text{-}DETECT}$. The LINE-RESET timer shall not rely on correct protocol operation. LINE-RESET exits to SLEEP on a transition to DIF-N. In an illustrative embodiment, $T_{LINE\text{-}RESET}$ is at least 3.1 milliseconds (ms) and $T_{LINE\text{-}RESET\text{-}DETECT}$ is between 1 ms and 3 ms.

Figure 4:
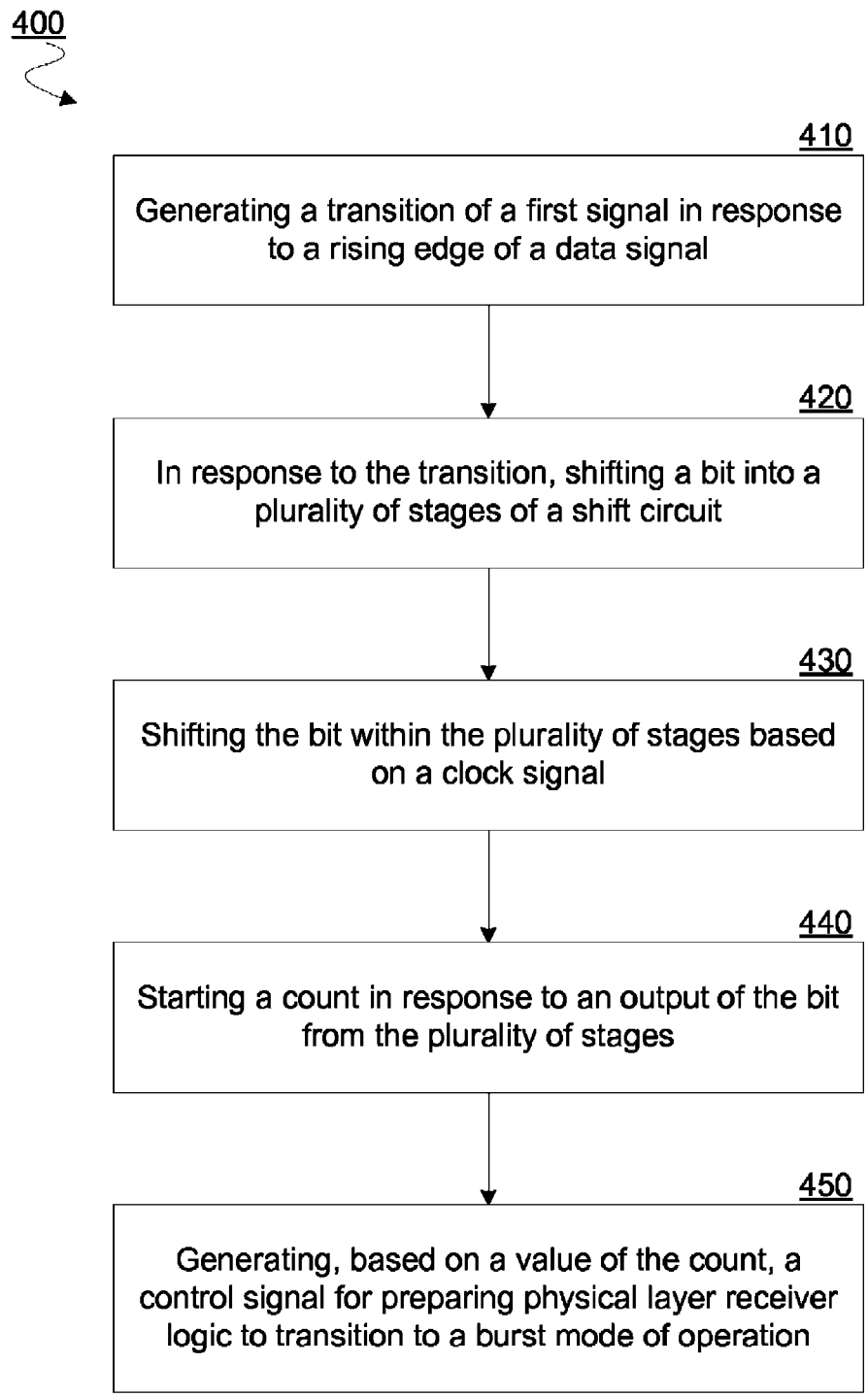
FIG. 4 is a flow diagram illustrating elements of a method for evaluating a received data signal according to an embodiment.

FIG. 4 illustrates elements of a method 400 for evaluating a data signal according to an embodiment. Method 400 may evaluate data exchanged in a system having some or all of the features of system 100, for example. In an embodiment, method 400 is performed at logic unit 103$_1$ or similar circuit logic of a high speed I/O receiver. Such a receiver may provide functionality compatible with a MIPI® M-PHY$^{SM}$ specification, although certain embodiments are not limited in this regard.

Method 400 may include, at 410, generating a transition of a first signal in response to a rising edge of the data signal. By way of illustration and not limitation, a rising edge detector of the receiver may receive the data signal, where the first signal is an output of the rising edge detector. In an embodiment, the data signal is a single-ended version of corresponding differential PWM data signals which, for example, receiver logic of a first device received from a second device and converted. Generating a single-ended version of such PWM data signals may be adapted from any of a variety of conventional techniques, which are not limiting on certain embodiments. The detected rising edge of the data signal may correspond to the beginning of DIF-P being asserted. Based on the rising edge, the rising edge detector may output a pulse or other transition of the first signal.

In response to the transition generated at 410, method 400 may, at 420, shift a bit into a plurality of stages of a shift circuit. In an embodiment, the shift circuit includes a shift register—e.g. where the plurality of stages is comprised of a plurality of daisy-chained flip-flops. Method 400 may further include, at 430, shifting the bit within the plurality of stages based on a clock signal. In an embodiment, the clock signal is generated at the device which received the PWM data signals—e.g. where the generating of the clock signal is independent of the PWM data signals. By way of illustration and not limitation, the clock signal may be a receive bus clock signal which is further used to synchronize exchanges on a receive bus of the device. In an embodiment, some or all of the plurality of stages are subject to a possible reset based on a subsequent falling edge of the data signal.

Method 400 may further include, at 440, starting a count in response to an output of the bit from the plurality of stages. The starting of the count at 440 may, in an embodiment, be based on a combination of the clock signal and the bit output from the shift circuit. Based on a value of the count, method 400 may further include, at 450, generating a control signal for preparing physical layer receiver logic to transition to a burst mode of operation. For example, combinatorial logic may be coupled to an output of the counter, where the combinatorial logic is to assert a signal to flag that the counter has counted to a particular value. In an embodiment, such a flag signal is the control signal generated at 450. In another embodiment, the flag signal is provided to a flip-flop or other circuit which, in turn, generates the control signal based on the flag signal.

The control signal may indicate that DIF-P has been asserted for at least a threshold period of time for a PREPARE condition, which is to initiate a transition from a sleep state or a stall state of physical layer receiver logic. The threshold period of time may, for example, be $T_{HS\text{-}PREPARE}$ or $T_{PWM\text{-}PREPARE}$ as specified in a MIPI® M-PHY$^{SM}$ specification. In an embodiment, physical layer receiver logic transitions to a burst mode—e.g. one of the HS-BURST mode and the PWM-BURST mode according to a MIPI® M-PHY$^{SM}$ specification.

Figure 5A:
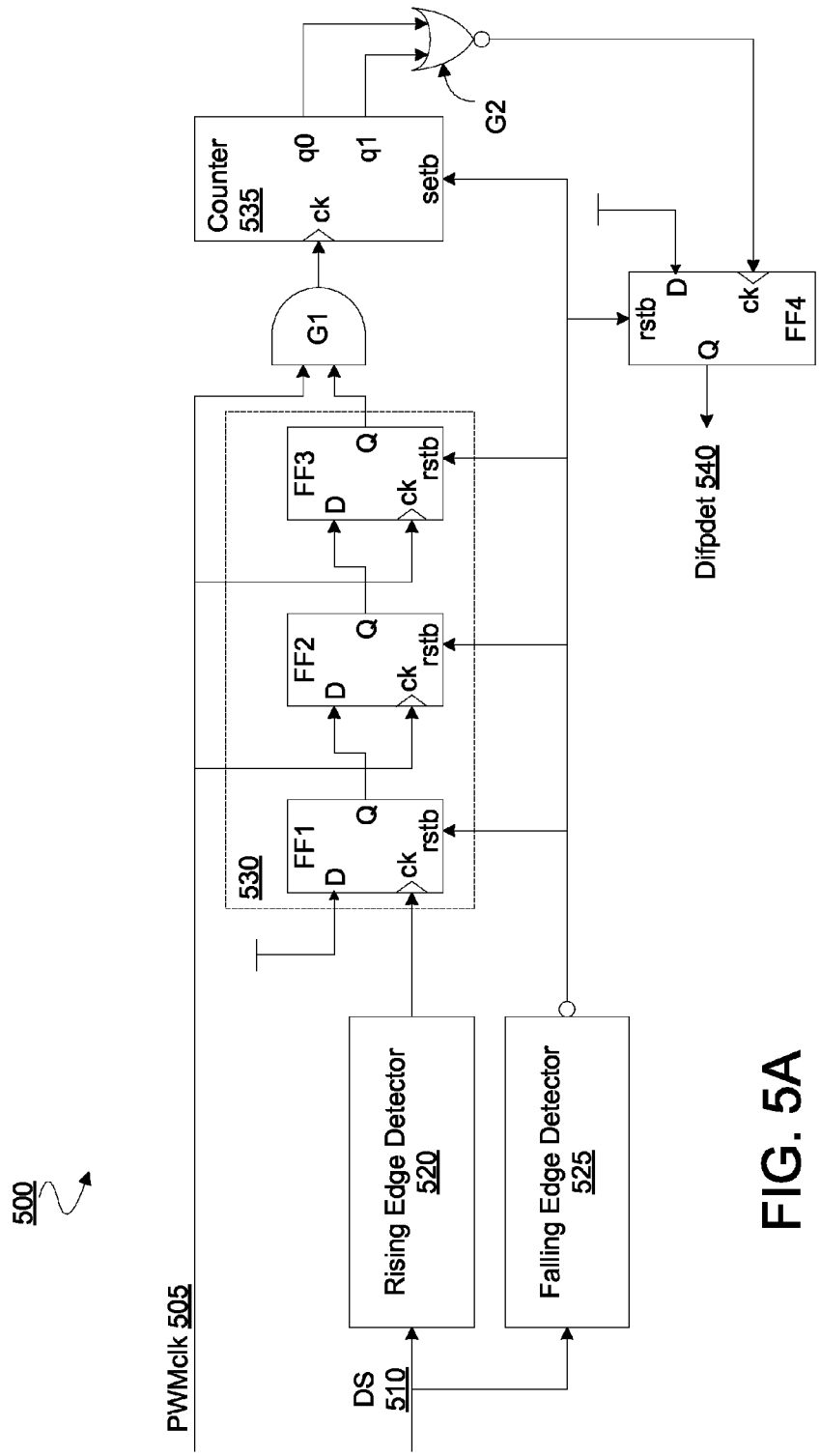
FIG. 5A is a hybrid block/circuit diagram illustrating elements of a receiver circuit for evaluating a data signal according to an embodiment.
Figure 5B:
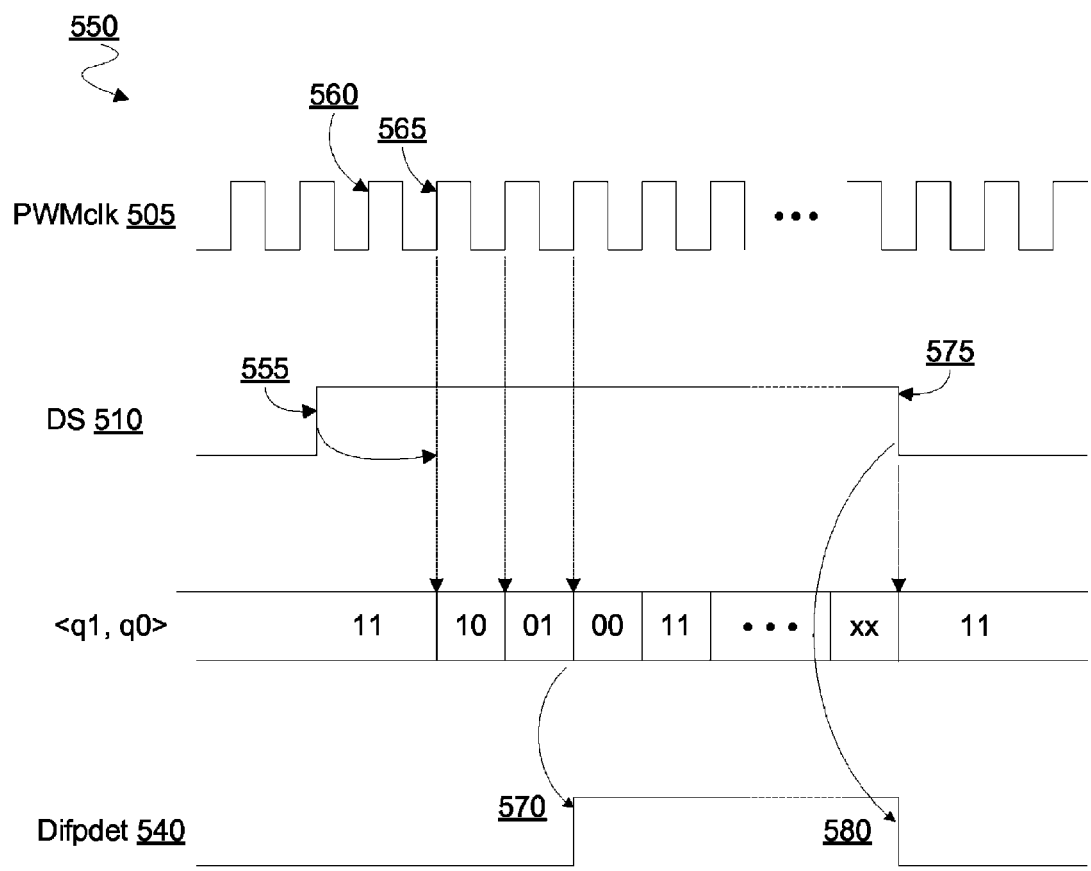
FIG. 5B is a timing diagram illustrating elements of operations by a receiver circuit for evaluating a data signal according to an embodiment.

FIG. 5A illustrates elements of a receiver circuit 500 for evaluating a data signal according to an embodiment. Receiver circuit 500 may include some or all of the features of logic unit 103$_1$, for example. In an embodiment, receiver circuit 500 performs the operations of method 400. FIG. 5B illustrates elements of a plurality of signals 550 which are exchanged for operation of receiver circuit 500 according to one embodiment.

In an embodiment, receiver circuit 500 includes rising edge detector 520 to receive data signal DS 510. DS 510 may include a single-ended version of PWM signals sent to a device which includes receiver circuit 500. Receiver circuit 500 may further include shift circuit 530—e.g. where rising edge detector 520 provides to shift circuit 530 an output signal based on DS 510. For example, rising edge detector 520 may detect a rising edge of DS 510—e.g. rising edge 555 in FIG. 5B—where the rising edge corresponds to a beginning of the PWM signals asserting DIF-P. In response to such an edge, rising edge detector 520 may assert a pulse or other transition of the signal output to shift circuit 530.

Shift circuit 530 may include a plurality of stages each to variously shift information into and through shift circuit 530—e.g. in response to a clock signal PWMclk 505. In an embodiment, PWMclk 505 is generated at the device which includes receiver circuit 500—e.g. independent of the PWM data signals which are sent to the device. PWMclk 505 may, for example, be a receive bus clock of the device, although certain embodiments are not limited in this regard.

By way of illustration and not limitation, shift circuit 530 may be a shift register, where the plurality of stages includes a plurality of daisy-chained flip-flops—e.g. including three flip-flops FF1, FF2, FF3. Such a plurality of stages may include any of a variety of additional or alternative flip-flops, according to different embodiments. The signal output from rising edge detector 520 may be provided as a clocking input to a first stage of shift circuit 530—e.g. as a clocking input signal for FF1. PWMclk 505 may be provided as the clocking input signal for some or all of the other stages of shift circuit 530. In such an embodiment, the transition of the signal from rising edge detector 520 may clock a bit into FF1—e.g. due to a data input D of FF1 being coupled to a voltage high. Subsequently, transitions of PWMclk 505—e.g. including rising edges 560, 565 in FIG. 5B—may successively shift the bit through and, in an embodiment, out of the plurality of stages.

Receiver circuit 500 may further include logic to initiate a count in response to the bit being shifted through shift circuit 530. By way of illustration and not limitation, receiver circuit 500 may include AND gate G1 to receive PWMclk 505 and the bit which is shifted out from shift circuit 530. In an embodiment, a resulting output of G1 may be provided as a clock input for a counter 535 of receiver circuit 500. Counter 535 may, for example, include 2-bit counter, although certain embodiments are not limited in this regard. In the architecture shown in FIG. 5A, gate G1 may provide for a counting by counter 535 which begins when a bit is output from shift circuit 530, where the count is incrementally changed (e.g. decremented or incremented) by successive cycles of PWMclk 505.

Receiver circuit 500 may further include logic to determine that the count by counter 535 has reached a particular value. By way of illustration and not limitation, receiver circuit 500 may include a NOR gate G2 to transition high when each input count bit—e.g. each of bits q0, q1 of counter 535—has reached logic level "0". A logic level output from gate G2 may be maintained, for example, by a flip-flop FF4 of receiver circuit 500—e.g. until a reset event is detected at FF4. In an embodiment, an output of FF4 is provided as a control signal Difpdet 540—e.g. where a transition 570 (shown in FIG. 5B) of Difpdet 540 is to indicate preparation of physical layer receiver logic for a transition to a burst mode of operation. For example, asserting a particular level of Difpdet 540 may signal a PREPARE condition, as defined in a MIPI® M-PHY$^{SM}$ specification.

In an illustrative scenario according to one embodiment, PWMclk 505 has a frequency on the order of 9 MHz and DS 510 provides data at a rate on the order of 3 Mb/s. However, certain embodiments are not limited with respect to such frequencies and/or rates. At such high operating speeds, conventional data evaluation circuitry is subject to erroneously responding to noise in a received data signal—e.g. where such circuitry mistakenly considers such noise as an intentional assertion of DIF-P.

One or more aspects of receiver circuit 500—e.g. the number of stages in shift circuit 500, the number of count bits in counter 535, the combinatorial logic for a particular reference count condition, etc.—may be chosen to implement a threshold period of time that DIF-P of DS 510 may be asserted before it is to be treated as indicative of a need to transition physical layer receiver logic to a burst mode. The threshold period of time may be a couple of microsecond or even on the order of nanoseconds, for example. In an embodiment, the threshold period of time corresponds to a particular GEAR of a MIPI® M-PHY$^{SM}$ specification.

Receiver circuit 500 may further include logic to transition to a reset state after receiver circuit 500 detects that the data signal has asserted DIF-P for at least a threshold time and/or after receiver circuit 500 detects that the data signal has transitioned back to DIF-N before completion of such a threshold time. By way of illustration and not limitation, receiver circuit 500 may further include falling edge detector 525 to detect a falling edge 575 of DS 510—e.g. where the falling edge corresponds to a beginning of DIF-N of the PWM signal being asserted. In response to such a falling edge 575, falling edge detector 525 may assert a pulse or other transition of a signal which is output to variously reset some or all of the plurality of stages of shift circuit 530. Additionally of alternatively, such a signal from falling edge detector 525 may reset counter 535 and/or FF4. Such reset signaling may reset counter 535 to some initial count value, clear some or all bits which are currently in shift circuit 530 and/or reset FF4 for a transition 580 of Difpdet 540 to indicate no current PREPARE condition.

Figure 6:
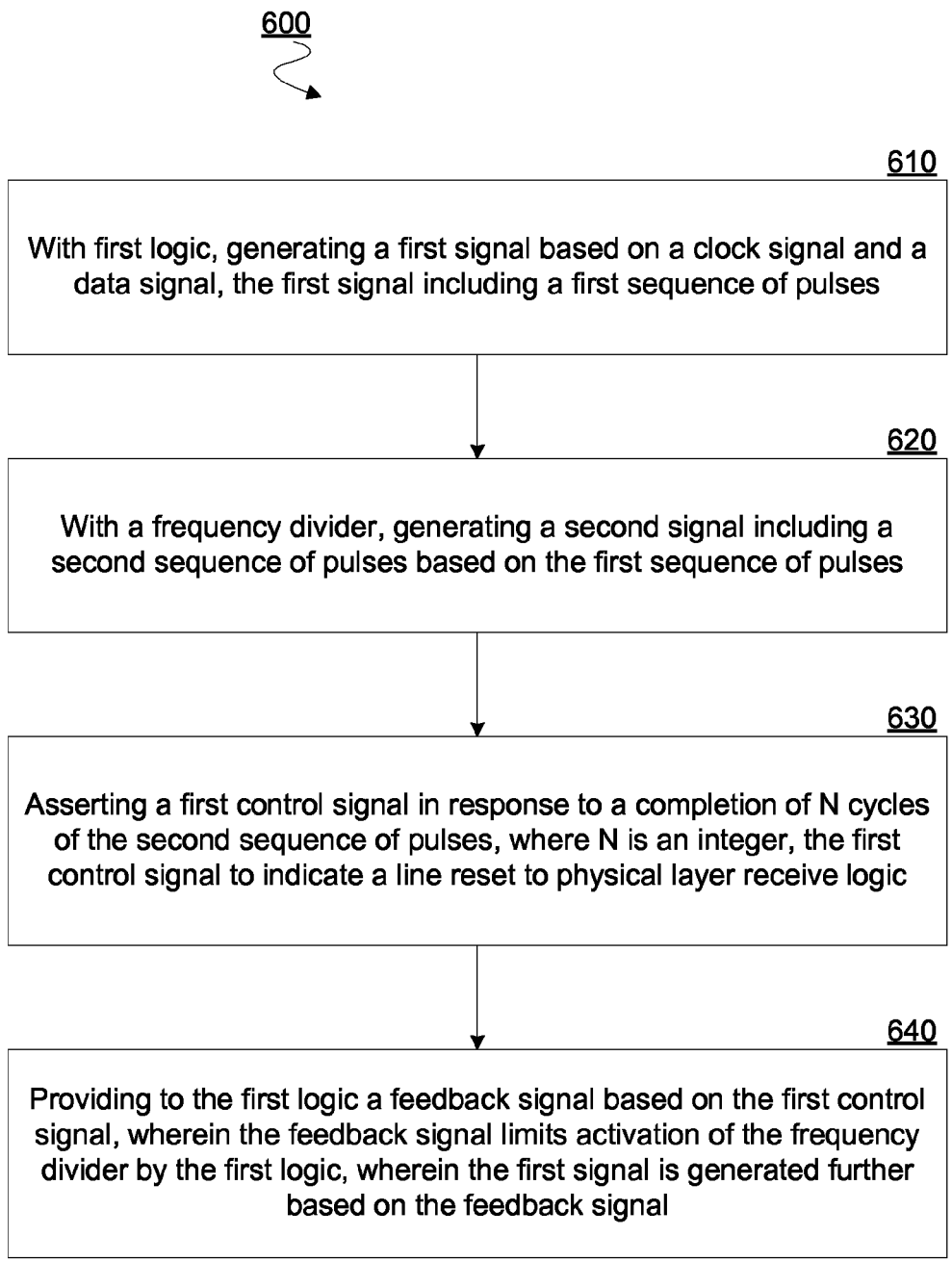
FIG. 6 is a flow diagram illustrating elements of a method for evaluating a received data signal according to an embodiment.

FIG. 6 illustrates elements of a method 600 for evaluating a data signal according to an embodiment. Method 600 may evaluate data exchanged in a system having some or all of the features of system 100, for example. In an embodiment, method 600 is performed at logic unit $103_1$ or similar circuit logic of a high speed I/O receiver. Such a receiver may provide functionality compatible with a MIPI® M-PHY$^{SM}$ specification, although certain embodiments are not limited in this regard.

Method 600 may include, at 610, generating with first logic a first signal based on a clock signal and a data signal, the first signal including a first sequence of pulses. The data signal may be a single-ended version of corresponding differential PWM data signals which, for example, receiver logic of a first device received from a second device. In an embodiment, the clock signal is generated at the first device—e.g. where the generating of the clock signal is independent of the differential data signals. By way of illustration and not limitation, the clock signal may be a transmit bus clock signal which is further used to synchronize exchanges on a transmit bus of the first device. To generate the first signal, the first logic may, for example, perform an AND operation with the data signal, the clock signal and a feedback signal.

Method 600 may further include, at 620, generating, with a frequency divider, a second signal including a second sequence of pulses based on the first sequence of pulses. A frequency of the first sequence of pulses may be an integer multiple of—e.g. sixty-four times—a frequency of the second set of pulses. Method 600 may further include, at 630, asserting a first control signal in response to a completion of some integer N cycles of the second sequence of pulses, the first control signal to indicate a line reset to physical layer receiver logic. In an illustrative embodiment, the integer N is equal to five.

Method 600 may further include, at 640, providing to the first logic a feedback signal based on the first control signal. In an embodiment, the feedback signal limits activation of the frequency divider by the first logic, wherein the first signal is generated further based on the feedback signal. The first control signal may indicate that the data signal has been asserted for at least a threshold period of time for indicating the line reset, wherein the threshold period of time is compatible with a MIPI® M-PHY$^{SM}$ specification.

In an embodiment, method 600 includes one or more additional operations (not shown) for returning circuitry which performs method 400 to a default state. By way of illustration and not limitation, method 400 may further include second logic of such circuitry generating a third signal which is based on the data signal and a status signal. The status signal may indicate, for example, whether the physical layer receiver logic is currently in a line reset mode. In an embodiment, the third signal is provided to reset the frequency divider and/or cycle counter logic which is to monitor for the completion of the N cycles of the second sequence of pulses.

Figure 7A:
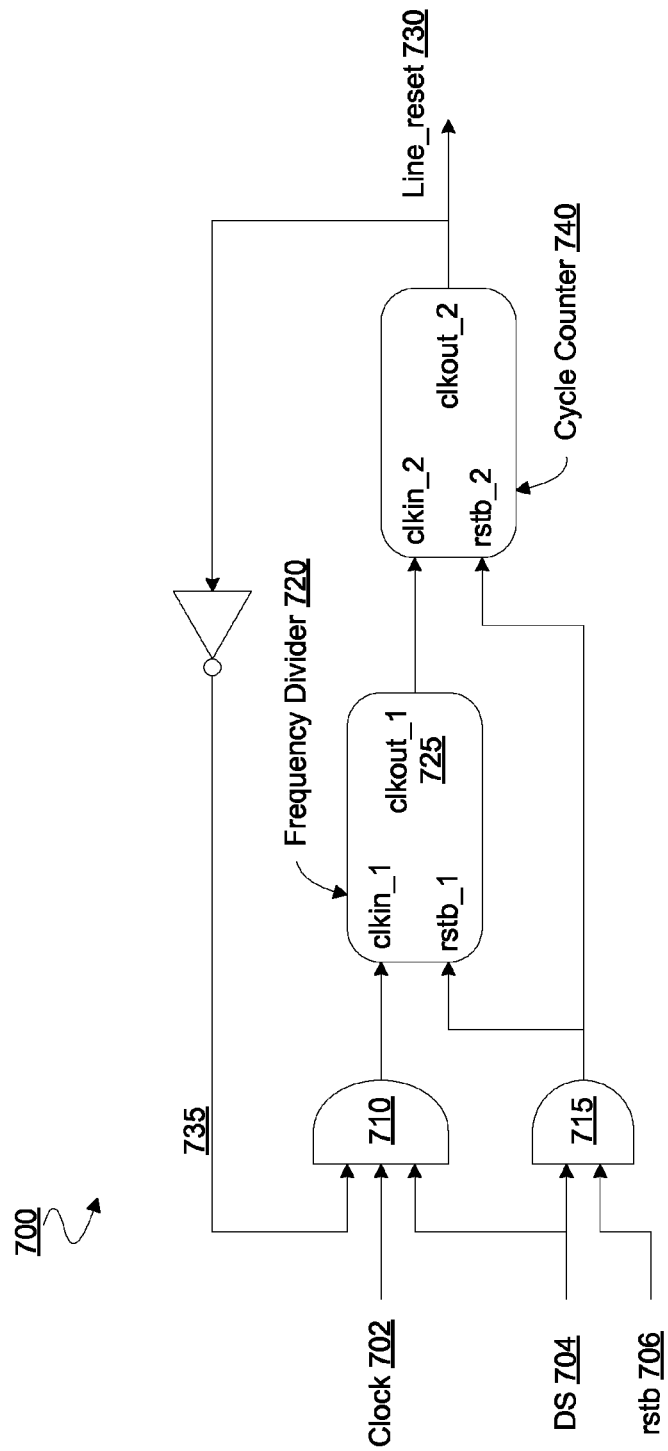
FIG. 7A is a hybrid block/circuit diagram illustrating elements of a receiver circuit for evaluating a data signal according to an embodiment.
Figure 7B:
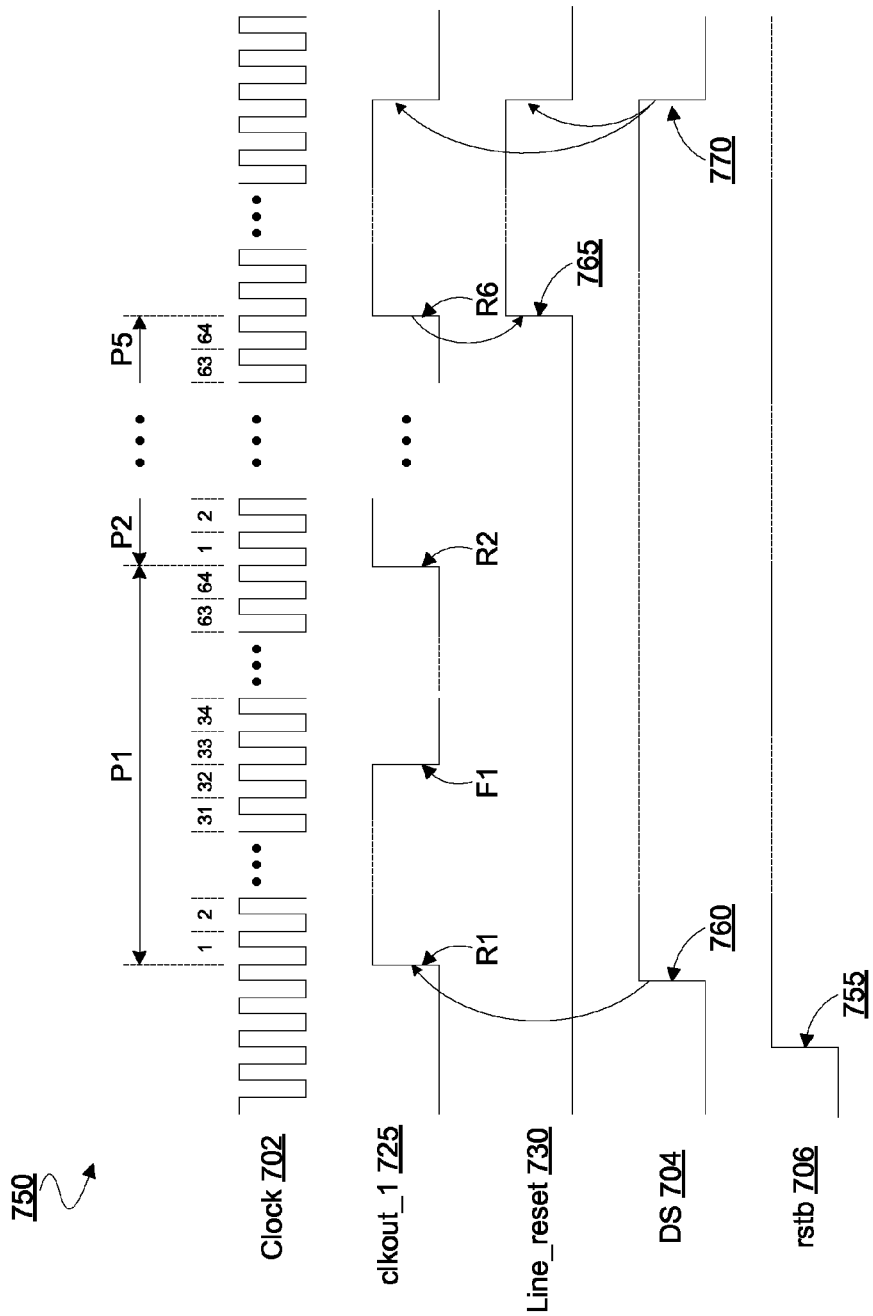
FIG. 7B is a timing diagram illustrating elements of operations by a receiver circuit for evaluating a data signal according to an embodiment.

FIG. 7A illustrates elements of a receiver circuit 700 for evaluating a data signal according to an embodiment. Receiver circuit 700 may include some or all of the features of logic unit 103$_1$, for example. In an embodiment, receiver circuit 700 performs the operations of method 600. FIG. 7B illustrates elements of a plurality of signals 750 which are exchanged for operation of receiver circuit 700 according to one embodiment.

In an embodiment, receiver circuit 700 includes first logic—e.g. including an AND gate 710—to generate a first signal based on a clock signal 702 and a data signal DS 704. As discussed herein, the first signal may be further based on a feedback signal 735. The first signal may include a first sequence of pulses which, for example, are output by gate 710 when feedback 735 and DS 704 are asserted at logic high (or "1")—e.g. where the first sequence of pulses correspond to respective cycles of clock 702.

Receiver circuit 700 may further include a frequency divider 720 to receive the first signal from the first logic—e.g. where the first signal is provided at a clocking input clkin__1 of frequency divider 720. Frequency divider 720 may provide at an output clkout__1 725 a second signal including a second sequence of pulses based on the first sequence of pulses. For example, the second sequence of pulses may be in response to the first sequence of pulses performing clocking at clkin__1. A frequency of the first sequence of pulses may be an integer multiple of—e.g. sixty-four times—a frequency of the second set of pulses.

Receiver circuit 700 may further include a cycle counter 740 to receive the second signal—e.g. where the second sequence of pulses is provided at a clocking input clkin__2 of cycle counter 740. Cycle counter 740 may provide at an output clkout__2 a signal which indicates completion of some integer N cycles of the signal provided at clkin__2. By way of illustration and not limitation, the signal at output clkout__2 may include a respective pulse or other transition for every Nth cycle—e.g. only for every Nth cycle—of the signal at clkin__1. Such a pulse or other transition may be triggered by a rising edge of every Nth cycle at clkin__2, although certain embodiments are not limited in this regard. N may be equal to five, in one embodiment.

Cycle counter 740 may assert a control signal Line_reset 730 in response to a completion of N cycles of the second sequence of pulses. Line_reset 730 may indicate a line reset to physical layer receiver logic included in or coupled to receive circuit 700. Line_reset 730 may indicate that DS 704 has asserted DIF-P for at least some threshold period of time for indicating the LINE-RESET mode defined in a MIPI® M-PHY$^{SM}$ specification.

In an embodiment, the first logic—e.g. gate 710—is to further receive a feedback signal 735 based on Line_reset 730—e.g. where feedback signal 735 is an inverted version of Line_reset 730. Feedback signal 735 may limit activation of the frequency divider 720 by the first logic. In turn, limiting activation of frequency divider 720 may limit counting operations performed by cycle counter 740. Accordingly, feedback signal 735 may provide power saving characteristics in operation of receiver circuit 700.

In an embodiment, receiver circuit 700 further includes logic for returning to a default state. By way of illustration and not limitation, receiver circuit 700 may further include second logic—e.g. including AND gate 715—to generate a third signal which is based on DS 704 and a status signal rstb 706. In an embodiment, rstb 706 is an a priori signal—e.g. generated according to conventional techniques beyond the scope of this disclosure—which indicates whether the physical layer receiver logic is currently in a line reset mode—e.g. where rstb 706 being at a logic high (e.g. "1" or "TRUE") logic level indicates that the physical layer receiver logic is not currently in a line reset mode. The third signal output from gate 715 may reset frequency divider 720 and/or cycle counter 740.

In a scenario illustrated by signals 750, a rising edge 755 transitions rstb 706 to a high logic state which, for example, is maintained during a rising edge 760 of DS 704. Rising edge 755 may reset frequency divider 720—e.g. the resetting to begin an output cycle at clkout__1 725 upon the next occurrence of some reference event—e.g. a next falling edge of a signal at clkin__1. Alternatively or in addition, rising edge 755 may reset to zero or some other baseline value a current cycle count which is maintained in cycle counter 740.

While both rstb 706 and DS 704 are high, pulses corresponding to those of clock 702 may be provided by gate 710 at clkin__1 of frequency divider 720. In the illustrative scenario, frequency divider 720 is a $\frac{1}{64}^{th}$ frequency divider, and cycle counter 740 counts every fifth cycle—i.e. where N equals five (5). However, any of a variety of other types of frequency division and/or cycle counting may be provided by receiver circuit 700, according to different embodiments.

Clock 702 may include a sequence of five components P1, P2, . . . , P5 which each include sixty-four clock cycles. In response to a first clock cycle of clock 702 after transitions 755, 760—e.g. in response to a first cycle of P1—frequency divider 720 may provide at clkout__1 725 a first rising edge R1 of a plurality of cycles. A frequency of the plurality of cycles at clkout__1 725 may be $\frac{1}{64}^{th}$ the frequency of P1, P2, . . . , P5. In an embodiment, cycle counter 740 detects completion of five (5) of the plurality of cycles of clkout__1 725—e.g. based on the rising edges (e.g. including R1, R2, etc.) and/or the falling edges (e.g. including F1, etc.) of clkout__1 725. In response to completion of the five cycles at clkout__1 725—e.g. in response to a rising edge R6 at the beginning of a sixth cycle—cycle counter 740 may implement a transition 765 to assert of Line_reset 730. Assertion of Line_reset 730 may result in feedback signal 735 stopping the plurality of cycles of clkout_1 725—e.g. where clkout_1 725 is subsequently held at logic high until, for example, a transition 770 to logic low by DS 704 (or a similar transition by rstb 706).

In many applications, the threshold period of time for identifying a line reset event may be rather large, as compared to the threshold period of time for detecting a PREPARE condition. Certain embodiments realize this tendency as an opportunity to use a clock 702 which is much slower than a receive bus clock, for example. In an embodiment, clock 702 is also used to synchronize exchanges on a transmit bus of the device which includes receive circuit 700. Such a transmit bus clock may have a frequency on the order of 320 KHz, although certain embodiments are not limited in this regard.

Figure 8:
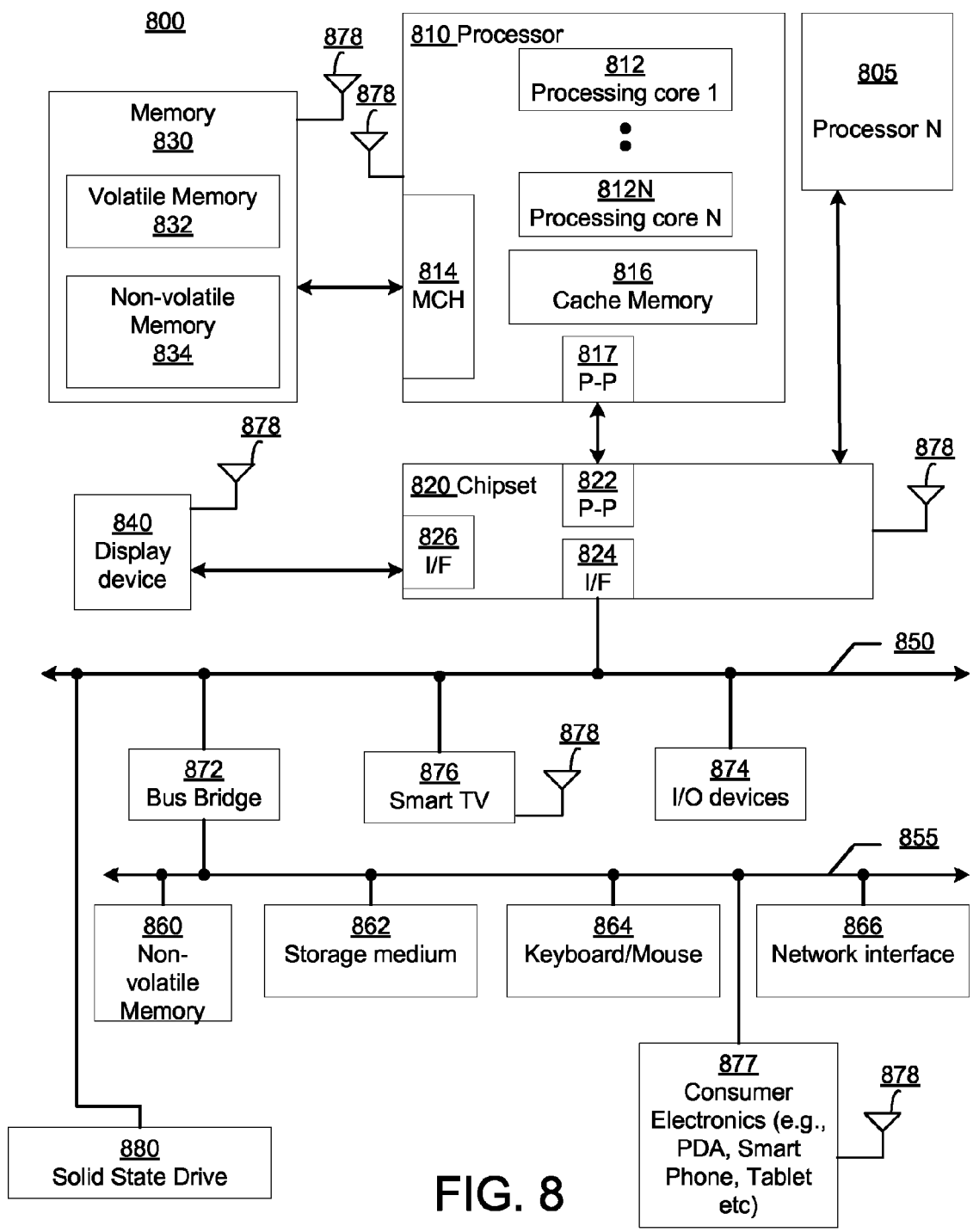
FIG. 8 is a block diagram illustrating elements of a computer system for exchanging data to be evaluated according to an embodiment.

FIG. 8 is a system level diagram 800 comprising a processor having a receiver to evaluate data (send by a transmitter), according to an embodiment. FIG. 8 may include a computer-readable storage medium to execute instructions to perform the methods of various embodiments. Elements of embodiments are also provided as a computer-readable storage medium for storing the computer-executable instructions (e.g., instructions to implement the processes discussed above and the flowchart of FIGS. 4 and 6). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 800 implements the methods disclosed herein and may be a system on a chip (SOC) system.

In one embodiment, the processor 810 has one or more processor cores 812 to 812N, where 812N represents the Nth processor core inside the processor 810 where N is a positive integer. In one embodiment, the system 800 includes multiple processors including processors 810 and 805, where processor 805 has logic similar or identical to logic of processor 810. In one embodiment, the system 800 includes multiple processors including processors 810 and 805 such that processor 805 has logic that is completely independent from the logic of processor 810. In such an embodiment, a multi-package system 800 is a heterogeneous multi-package system because the processors 805 and 810 have different logic units. In one embodiment, the processing core 812 includes, but is not limited to, pre-fetch logic to fetch instructions, decode logic to decode the instructions, execution logic to execute instructions and the like. In one embodiment, the processor 810 has a cache memory 816 to cache instructions and/or data of the system 800. In another embodiment of the invention, the cache memory 816 includes level one, level two and level three, cache memory, or any other configuration of the cache memory within the processor 810.

In one embodiment, processor 810 includes a memory control hub (MCH) 814, which is operable to perform functions that enable the processor 810 to access and communicate with a memory 830 that includes a volatile memory 832 and/or a non-volatile memory 834. In one embodiment, the memory control hub (MCH) 814 is positioned outside of the processor 810 as an independent integrated circuit.

In one embodiment, the processor 810 is operable to communicate with the memory 830 and a chipset 820. In such an embodiment, the SSD 880 executes the computer-executable instructions when the SSD 880 is powered up.

In one embodiment, the processor 810 is also coupled to a wireless antenna 878 to communicate with any device configured to transmit and/or receive wireless signals. In one embodiment, the wireless antenna interface 878 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 834 includes, but is not limited to, flash memory (e.g., NAND, NOR), phase change memory (PCM), read-only memory (ROM), electrically erasable programmable read-only memory (EEPROM), or any other type of non-volatile memory device.

The memory 830 stores information and instructions to be executed by the processor 810. In one embodiment, memory 830 may also store temporary variables or other intermediate information while the processor 810 is executing instructions. In one embodiment, chipset 820 connects with processor 810 via Point-to-Point (PtP or P-P) interfaces 817 and 822. In one embodiment, chipset 820 enables processor 810 to connect to other modules in the system 800. In one embodiment of the invention, interfaces 817 and 822 operate in accordance with a PtP communication protocol such as the INTEL® QuickPath Interconnect (QPI) or the like.

In one embodiment, the chipset 820 is operable to communicate with the processor 810, 805, display device 840, and other devices 872, 876, 874, 860, 862, 864, 866, 877, etc. In one embodiment, the chipset 820 is also coupled to a wireless antenna 878 to communicate with any device configured to transmit and/or receive wireless signals.

In one embodiment, chipset 820 connects to a display device 840 via an interface 826. In one embodiment, the display device 840 includes, but is not limited to, liquid crystal display (LCD), plasma, cathode ray tube (CRT) display, or any other form of visual display device. In one embodiment of the invention, processor 810 and chipset 820 are merged into a single SOC. In addition, the chipset 820 connects to one or more buses 850 and 855 that interconnect various modules 874, 860, 862, 864, and 866. In one embodiment, buses 850 and 855 may be interconnected together via a bus bridge 872 if there is a mismatch in bus speed or communication protocol. In one embodiment, chipset 820 couples with, but is not limited to, a non-volatile memory 860, a mass storage device(s) 862, a keyboard/mouse 864, and a network interface 866 via interface 824, smart TV 876, consumer electronics 877, etc.

In one embodiment, the mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although the cache memory 816 is depicted as a separate block within the processor 810, the cache memory 816 can be incorporated into the processor core 812 respectively. In one embodiment, the system 800 may include more than one processor/processing core in another embodiment of the invention.

In one aspect, a receiver circuit comprises a first edge detector to receive a data signal and to generate a transition of a first signal in response to a rising edge of the data signal. The receiver circuit further includes a shift circuit comprising a plurality of stages to receive a bit in response to the transition and to shift the bit based on a clock signal. The receiver circuit further includes a counter to start a count in response to an output of the bit from the plurality of stages, and detector logic to detect a value of the count and to generate, based on the value, a control signal for preparing physical layer receiver logic to transition to a burst mode of operation.

In an embodiment, the burst mode of operation is compatible with a physical layer serial interface specification. In an embodiment, the receiver circuit further comprises a second edge detector to receive the data signal and to reset the shift circuit in response to a falling edge of the data signal. In an embodiment, the receiver circuit further comprises a second edge detector to receive the data signal and to reset the counter in response to a falling edge of the data signal. In an embodiment, the receiver circuit is to operate in a first device, wherein the data signal includes a single-ended signal based on a differential data signal sent to the first device from a second device.

In an embodiment, the receiver circuit further comprises combinatorial logic coupled between the shift register and the counter, the combinatorial logic to receive the clock signal and the bit and to indicate to the counter a combination of the clock signal and the bit, wherein the counter is to start the count based on the indicated combination of the clock signal and the bit. In an embodiment, the control signal indicates that the data signal has been asserted for at least a threshold period of time indicating a transition from one of a sleep state and a stall state, wherein the threshold period of time is compatible with a physical layer serial interface specification. In an embodiment, the plurality of stages consists of three stages each to perform a respective bit shift based on the clock signal.

In another aspect, a system comprises a receiver circuit including a first edge detector to receive a data signal and to generate a transition of a first signal in response to a rising edge of the data signal. The receiver circuit further comprises a shift circuit comprising a plurality of stages to receive a bit in response to the transition and to shift the bit based on a clock signal. The receiver circuit further comprises a counter to start a count in response to an output of the bit from the plurality of stages, and detector logic to detect a value of the count and to generate, based on the value, a control signal for preparing physical layer receiver logic to transition to a burst mode of operation. The system further comprises a display unit to display a version of data received via the physical layer receiver logic.

In an embodiment, the burst mode of operation is compatible with a physical layer serial interface specification. In an embodiment, the receiver circuit further comprising a second edge detector to receive the data signal and to reset the shift circuit in response to a falling edge of the data signal. In an embodiment, the receiver circuit further comprising a second edge detector to receive the data signal and to reset the counter in response to a falling edge of the data signal. In an embodiment, the data signal includes a single-ended signal based on a differential data signal sent to the system from a device.

In an embodiment, the receiver circuit further comprises combinatorial logic coupled between the shift register and the counter, the combinatorial logic to receive the clock signal and the bit and to indicate to the counter a combination of the clock signal and the bit, wherein the counter is to start the count based on the indicated combination of the clock signal and the bit. In an embodiment, the control signal indicates that the data signal has been asserted for at least a threshold period of time indicating a transition from one of a sleep state and a stall state, wherein the threshold period of time is compatible with a physical layer serial interface specification.

In another aspect, a receiver circuit comprises first logic to generate a first signal based on a clock signal and a data signal, the first signal including a first sequence of pulses and a frequency divider to receive the first signal and to generate a second signal including a second sequence of pulses based on the first sequence of pulses. The receiver circuit further comprises a cycle counter to receive the second signal and to assert a first control signal in response to a completion of N cycles of the second sequence of pulses, where N is an integer, the first control signal to indicate a line reset to physical layer receiver logic. The first logic is further to receive a feedback signal based on the first control signal, the feedback signal to limit activation of the frequency divider by the first logic, wherein the first logic is to generate the first signal further based on the feedback signal.

In an embodiment, a frequency of the first sequence of pulses is sixty-four times a frequency of the second sequence of pulses. In an embodiment, N is equal to five. In an embodiment, the first control signal indicates that the data signal has been asserted for at least a threshold period of time for indicating the line reset, wherein the threshold period of time is compatible with a physical layer serial interface specification. In an embodiment, the physical layer receiver logic, in response to the first control signal, performs the line reset compatible with a physical layer serial interface specification.

In an embodiment, the receiver circuit further comprises second logic to generate a third signal based on the data signal and a status signal indicating whether the physical layer receiver logic is currently in a line reset mode, wherein the third signal is to reset the frequency divider. In an embodiment, the receiver circuit further comprises second logic to generate a third signal based on the data signal and a status signal indicating whether the physical layer receiver logic is currently in a line reset mode, wherein the third signal to reset the cycle counter. In an embodiment, the receiver circuit is to operate in a first device, wherein the data signal includes a single-ended signal based on a differential data signal sent to the first device from a second device.

In another aspect, a system comprises a receiver circuit including first logic to generate a first signal based on a clock signal and a data signal, the first signal including a first sequence of pulses, and a frequency divider to receive the first signal and to generate a second signal including a second sequence of pulses based on the first sequence of pulses. The receiver circuit further comprises a cycle counter to receive the second signal and to assert a first control signal in response to a completion of N cycles of the second sequence of pulses, where N is an integer, the first control signal to indicate a line reset to physical layer receiver logic. The first logic further is to receive a feedback signal based on the first control signal, the feedback signal to limit activation of the frequency divider by the first logic, wherein the first logic is to generate the first signal further based on the feedback signal. The system further comprises a display unit to display a version of data received via the physical layer receiver logic.

In an embodiment, a frequency of the first sequence of pulses is sixty-four times a frequency of the second sequence of pulses. In an embodiment, N is equal to five. In an embodiment, the first control signal indicates that the data signal has been asserted for at least a threshold period of time for indicating the line reset, wherein the threshold period of time is compatible with a physical layer serial interface specification.

In an embodiment, the receiver circuit further comprises second logic to generate a third signal based on the data signal and a status signal indicating whether the physical layer receiver logic is currently in a line reset mode, wherein the third signal is to reset the frequency divider. In an embodiment, the receiver circuit further comprises second logic to generate a third signal based on the data signal and a status signal indicating whether the physical layer receiver logic is currently in a line reset mode, wherein the third signal is to reset the cycle counter. In an embodiment, the receiver circuit is to operate in a first device, wherein the data signal includes a single-ended signal based on a differential data signal sent to the first device from a second device. Techniques and architectures for performing I/O communications are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A receiver circuit comprising:
   a first edge detector to receive a data signal and to generate a transition of a first signal in response to a rising edge of the data signal;
   a shift circuit comprising a plurality of stages to receive a bit in response to the transition and to shift the bit based on a clock signal;
   a counter to start a count in response to an output of the bit from the plurality of stages; and
   detector logic to detect a value of the count and to generate, based on the value, a control signal for preparing physical layer receiver logic to transition to a burst mode of operation.

2. The receiver circuit of claim 1, wherein the burst mode of operation is compatible with a physical layer serial interface specification.

3. The receiver circuit of claim 1, further comprising a second edge detector to receive the data signal and to reset the shift circuit in response to a falling edge of the data signal.

4. The receiver circuit of claim 1, further comprising a second edge detector to receive the data signal and to reset the counter in response to a falling edge of the data signal.

5. The receiver circuit of claim 1, wherein the receiver circuit to operate in a first device, and wherein the data signal includes a single-ended signal based on a differential data signal sent to the first device from a second device.

6. The receiver circuit of claim 1, further comprising combinatorial logic coupled between the shift register and the counter, the combinatorial logic to receive the clock signal and the bit and to indicate to the counter a combination of the clock signal and the bit, wherein the counter to start the count based on the indicated combination of the clock signal and the bit.

7. The receiver circuit of claim 1, wherein the control signal indicates that the data signal has been asserted for at least a threshold period of time indicating a transition from one of a sleep state and a stall state, wherein the threshold period of time is compatible with a physical layer serial interface specification.

8. The receiver circuit of claim 1, wherein the plurality of stages consists of three stages each to perform a respective bit shift based on the clock signal.

9. A system comprising:
a receiver circuit including:
a first edge detector to receive a data signal and to generate a transition of a first signal in response to a rising edge of the data signal;
a shift circuit comprising a plurality of stages to receive a bit in response to the transition and to shift the bit based on a clock signal;
a counter to start a count in response to an output of the bit from the plurality of stages; and
detector logic to detect a value of the count and to generate, based on the value, a control signal for preparing physical layer receiver logic to transition to a burst mode of operation; and
a display unit to display a version of data received via the physical layer receiver logic.

10. The system of claim 9, wherein the burst mode of operation is compatible with a physical layer serial interface specification.

11. The system of claim 9, the receiver circuit further comprising a second edge detector to receive the data signal and to reset the shift circuit in response to a falling edge of the data signal.

12. The system of claim 9, the receiver circuit further comprising a second edge detector to receive the data signal and to reset the counter in response to a falling edge of the data signal.

13. The system of claim 9, wherein the data signal includes a single-ended signal based on a differential data signal sent to the system from a device.

14. The system of claim 9, the receiver circuit further comprising combinatorial logic coupled between the shift register and the counter, the combinatorial logic to receive the clock signal and the bit and to indicate to the counter a combination of the clock signal and the bit, wherein the counter to start the count based on the indicated combination of the clock signal and the bit.

15. The system of claim 9, wherein the control signal indicates that the data signal has been asserted for at least a threshold period of time indicating a transition from one of a sleep state and a stall state, wherein the threshold period of time is compatible with a physical layer serial interface specification.

16. A receiver circuit comprising:
first logic to generate a first signal based on a clock signal and a data signal, the first signal including a first sequence of pulses;
a frequency divider to receive the first signal and to generate a second signal including a second sequence of pulses based on the first sequence of pulses; and
a cycle counter to receive the second signal and to assert a first control signal in response to a completion of N cycles of the second sequence of pulses, where N is an integer, the first control signal to indicate a line reset to physical layer receiver logic;
wherein the first logic further to receive a feedback signal based on the first control signal, the feedback signal to limit activation of the frequency divider by the first logic, wherein the first logic to generate the first signal further based on the feedback signal.

17. The receiver circuit of claim 16, wherein a frequency of the first sequence of pulses is sixty-four times a frequency of the second sequence of pulses.

18. The receiver circuit of claim 16, where N is equal to five.

19. The receiver circuit of claim 16, wherein the first control signal indicates that the data signal has been asserted for at least a threshold period of time for indicating the line reset, wherein the threshold period of time is compatible with a physical layer serial interface specification.

20. The receiver circuit of claim 16, wherein the physical layer receiver logic, in response to the first control signal, performs the line reset compatible with a physical layer serial interface specification.

21. The receiver circuit of claim 16, further comprising second logic to generate a third signal based on the data signal and a status signal indicating whether the physical layer receiver logic is currently in a line reset mode, wherein the third signal to reset the frequency divider.

22. The receiver circuit of claim 16, further comprising second logic to generate a third signal based on the data signal and a status signal indicating whether the physical layer receiver logic is currently in a line reset mode, wherein the third signal to reset the cycle counter.

23. The receiver circuit of claim 16, wherein the receiver circuit to operate in a first device, and wherein the data signal includes a single-ended signal based on a differential data signal sent to the first device from a second device.

24. A system comprising:
a receiver circuit including:
first logic to generate a first signal based on a clock signal and a data signal, the first signal including a first sequence of pulses;
a frequency divider to receive the first signal and to generate a second signal including a second sequence of pulses based on the first sequence of pulses; and
a cycle counter to receive the second signal and to assert a first control signal in response to a completion of N cycles of the second sequence of pulses, where N is an integer,
the first control signal to indicate a line reset to physical layer receiver logic;
wherein the first logic further to receive a feedback signal based on the first control signal, the feedback signal to limit activation of the frequency divider by the first logic, wherein the first logic to generate the first signal further based on the feedback signal; and
a display unit to display a version of data received via the physical layer receiver logic.

25. The system of claim 24, wherein a frequency of the first sequence of pulses is sixty-four times a frequency of the second sequence of pulses.

26. The system of claim 24, where N is equal to five.

27. The system of claim 24, wherein the first control signal indicates that the data signal has been asserted for at least a threshold period of time for indicating the line reset, wherein the threshold period of time is compatible with a physical layer serial interface specification.

28. The system of claim 24, the receiver circuit further comprising second logic to generate a third signal based on the data signal and a status signal indicating whether the physical layer receiver logic is currently in a line reset mode, wherein the third signal to reset the frequency divider.

29. The system of claim 24, the receiver circuit further comprising second logic to generate a third signal based on the data signal and a status signal indicating whether the physical layer receiver logic is currently in a line reset mode, wherein the third signal to reset the cycle counter.

30. The system of claim 24, wherein the receiver circuit to operate in a first device, and wherein the data signal includes a single-ended signal based on a differential data signal sent to the first device from a second device.

* * * * *